United States Patent
Mastroianni et al.

(10) Patent No.: US 6,940,756 B2
(45) Date of Patent: Sep. 6, 2005

(54) NON-VOLATILE MEMORY DEVICE WITH IMPROVED SEQUENTIAL PROGRAMMING SPEED

(75) Inventors: Francesco Mastroianni, Milan (IT); Massimiliano Scotti, Cernusco Sul Naviglio (IT); Antonio Geraci, Monza (IT); Andrea Pozzato, Paderno Dugnano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 11 days.

(21) Appl. No.: 10/739,928

(22) Filed: Dec. 18, 2003

(65) Prior Publication Data

US 2004/0165434 A1 Aug. 26, 2004

(30) Foreign Application Priority Data

Dec. 18, 2002 (IT) .................................. MI2002A02668

(51) Int. Cl.[7] .............................................. G11C 16/04
(52) U.S. Cl. .............................. 365/185.11; 365/185.28; 365/236
(58) Field of Search ...................... 365/185.11, 185.28, 365/236, 185.18, 239, 240

(56) References Cited

U.S. PATENT DOCUMENTS 6,166,953 A * 12/2000 Matsubara et al. ..... 365/185.11

* cited by examiner

*Primary Examiner*—David Lam
(74) *Attorney, Agent, or Firm*—Lisa K. Jorgenson; David V. Carlson; SEED IP Law Group PLLC

(57) ABSTRACT

A non-volatile memory device suitable to be programmed in a sequential mode. The device includes a plurality of blocks of memory cells each one for storing a word, each block being identified by an address. An input circuit for loading an input address at the beginning of a programming procedure and an internal circuit for setting an internal address to the input address. The device further includes a data input circuit for loading a predetermined number of input words in succession, and a latch circuit for latching a page consisting of the predetermined number of input words. The memory then executes a programming operation including writing the page in the blocks identified by consecutive addresses starting from the internal address, and increments the internal address of the predetermined number in response to the completion of the programming operation.

18 Claims, 3 Drawing Sheets

NON-VOLATILE MEMORY DEVICE WITH IMPROVED SEQUENTIAL PROGRAMMING SPEED

FIELD OF THE INVENTION

The present invention relates to a non-volatile memory device.

BACKGROUND OF THE INVENTION

Several types of non-volatile memory devices (such as the flash $E^2$PROMs) are commonly used for storing information that has to be preserved even when a power supply is off. These memory devices are very often programmed (for example, in a factory) writing a great amount of information sequentially.

The speed of this sequential programming procedure is very important, especially when the memory device has a high capacity. Particularly, a bottleneck for the whole procedure is represented by the time required for switching an address of each word that has to be written onto the memory device.

Some methods have been proposed in the last years for improving the programming procedure. A known solution uses a parallel multi-programming technique, in which a page formed by 2 or 4 consecutive words is simultaneously written onto the memory device. Nevertheless, a new address has always to be provided for each page from the outside.

In a different method, known as "Enhanced Factory Programming" (EFP), the address is automatically increased inside the memory device after the writing of each word. A drawback of this solution is that it allows writing only one word at the time. Furthermore, the method EFP provides a starting phase in which a single attempt of writing is performed for each word; at the end of such a writing phase, all the words are verified and possibly re-written in succession. However, this requires providing the information to be written twice to the memory device.

The drawbacks of both the solutions involve a low speed of a production line for apparatuses embodying the memory devices; this results in a reduction of the yield of the production line, with a corresponding increase of the cost of those apparatuses.

It is important to point out that the two techniques described above propose modes of operation of the memory device that are completely different. In other words, such solutions have been always considered alternative and incompatible to each other.

BRIEF SUMMARY OF THE INVENTION

One object of the present invention is to provide a non-volatile memory device with improved sequential programming speed.

It is another object of the present invention to provide a memory device that allows both writing more words simultaneously and increasing the address inside the memory device automatically.

It is yet another object of the present invention to provide a memory device that supports a programming procedure specifically optimized for a production environment.

In order to achieve these and other related objects, a device as set out in the first claim is proposed.

Briefly, the present invention provides a non-volatile memory device suitable to be programmed in a sequential mode including a plurality of blocks of memory cells each one for storing a word, each block being identified by an address, means for loading an input address at the beginning of a programming procedure and means for setting an internal address to the input address; the device further includes means for loading a predetermined number of input words in succession, means for latching a page consisting of the predetermined number of input words, means for executing a programming operation including writing the page in the blocks identified by consecutive addresses starting from the internal address, and means for incrementing the internal address of the predetermined number in response to the completion of the programming operation.

Furthermore, the present invention proposes a corresponding programming method; a programming device for this memory device and a corresponding method of controlling the programming are also encompassed.

BRIEF DESCRIPTION OF THE SEVERAL VIEWS OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
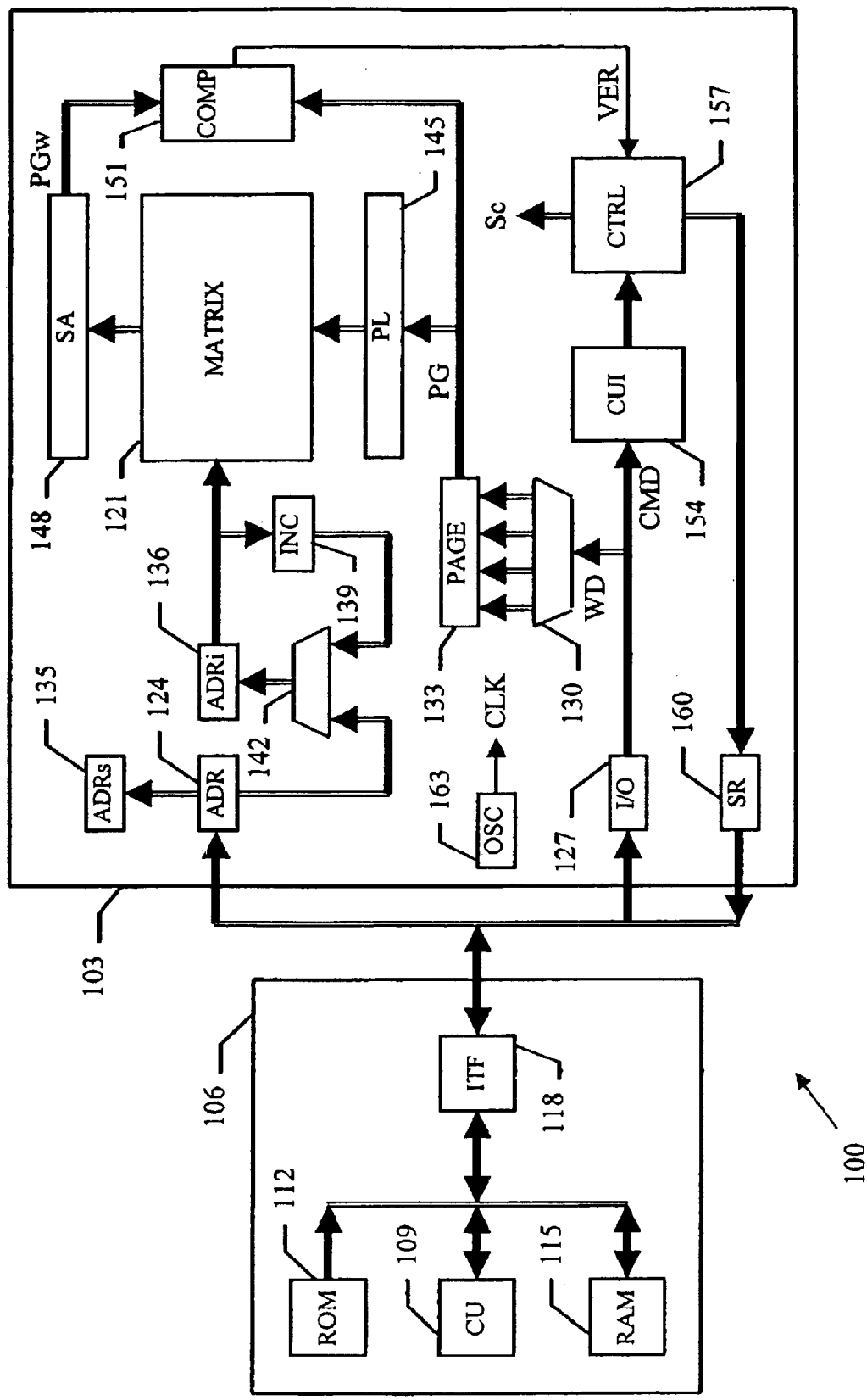
FIG. 1 is a schematic block diagram of a system for programming a non-volatile memory device in a sequential mode.

With reference in particular to FIG. 1, a system 100 for programming a memory device 103 sequentially is shown; such a sequential programming procedure is performed under the control of a programming device 106. Typically, the system 100 is used in the factory during the production of apparatuses that embody the memory device 103.

The programming device 106 includes a control unit (CU) 109, which is associated with a non-volatile memory (ROM) 112 and with a working memory (RAM) 115 in a conventional manner. The programming device 106 is further equipped with an interface 118 for communicating with the memory device 103.

The memory device 103 (for example, a flash $E^2$PROM) includes a matrix 121 of memory cells, each one storing a bit of information; generally, the matrix 121 is partitioned into a plurality of sectors (for example, each one of 512k memory cells). A word (typically of 16 bits) is simultaneously processed by the flash memory 103; each word is stored in a block of memory cells (location), which is identified by a corresponding address.

An address buffer 124 and an input/output buffer (I/O) 127 are used for loading information provided by the programming device 106. Particularly, the address buffer 124 latches an input address ADR; instead, the I/O buffer 127 receives input commands CMD for the flash memory 103 or input words WD to be written onto the matrix 121.

Each input word WD is provided to a demultiplexer 130. The demultiplexer 130 controls the loading of the input word WD into a selected portion of a buffer 133, which latches a page PG consisting of 4 consecutive words.

The input address ADR provided at the beginning of the programming procedure is stored (as a starting address ADRs) into a register 135. Further, a counter 136 stores an internal address ADRi for accessing the matrix 121. The internal address ADRi is provided to an adder 139, which increments the internal address ADRi by the number of words included in each page, in one embodiment, this is 4. The address buffer 124 and the adder 139 are connected to respective inputs of a multiplexer 142. In this way, the multiplexer 142 selectively loads the input address ADR that has been latched in the buffer 124 or the internal address ADRi after it has been incremented by the adder 139 into the counter 136.

The internal address ADRi selects (by means of a row decoder and a column decoder, not shown in the drawing) a set of locations that corresponds to the word length. In one embodiment, the word has a length of 4, so a set of 4 locations are selected in the matrix 121. The selected locations are identified by consecutive addresses starting from the internal address ADRi. The page PG (in the buffer 133) is provided to a writing unit (PL) 145; the unit 145 controls the writing of the page PG onto the set of selected locations.

Instead, a unit (SA) 148 is used for reading a page PGw written in the same set of selected locations. The page PG (in the buffer 133) and the page PGw (from the reading unit 148) are provided to respective inputs of a comparator 151. The comparator 151 generates a signal VER indicative of the result of a verification of the written page PGw.

The I/O buffer 127 is further coupled with a command interface (CUI) 154. The command interface 154 processes the input commands CMD latched in the I/O buffer 127, and enables a controller (CTRL) 157 accordingly. The controller 157 receives the verification signal VER (from the comparator 151) and generates a sequence of command signals (denoted as a whole with Sc), which cause the execution of the operations required by each input command CMD on the matrix 121. The controller 157 further updates the content of a register (SR) 160, which is used to store state information indicative of an operative condition of the flash memory 103; the state register 160 is directly accessible by the programming device 106. Particularly, a bit of the state register 160 (for example, the bit SR.0) is used as a flag for a busy condition of the flash memory 103. At the end, a timing unit (OSC) 163 generates a clock signal (CLK), which is used to synchronize the operation of the whole flash memory 103.

The concepts of the present invention are also applicable when the programming system has a different structure, or when a non-volatile memory device of another type is used (for example, an EPROM). Similar considerations apply if the flash memory includes further functional units, or if the command interface is replaced with an equivalent logic unit. Alternatively, the sectors have a different size or sometimes the words may be of a different size or, each page is formed by another number of words, the internal address is incremented in a different way, and the like.

Figure 2:
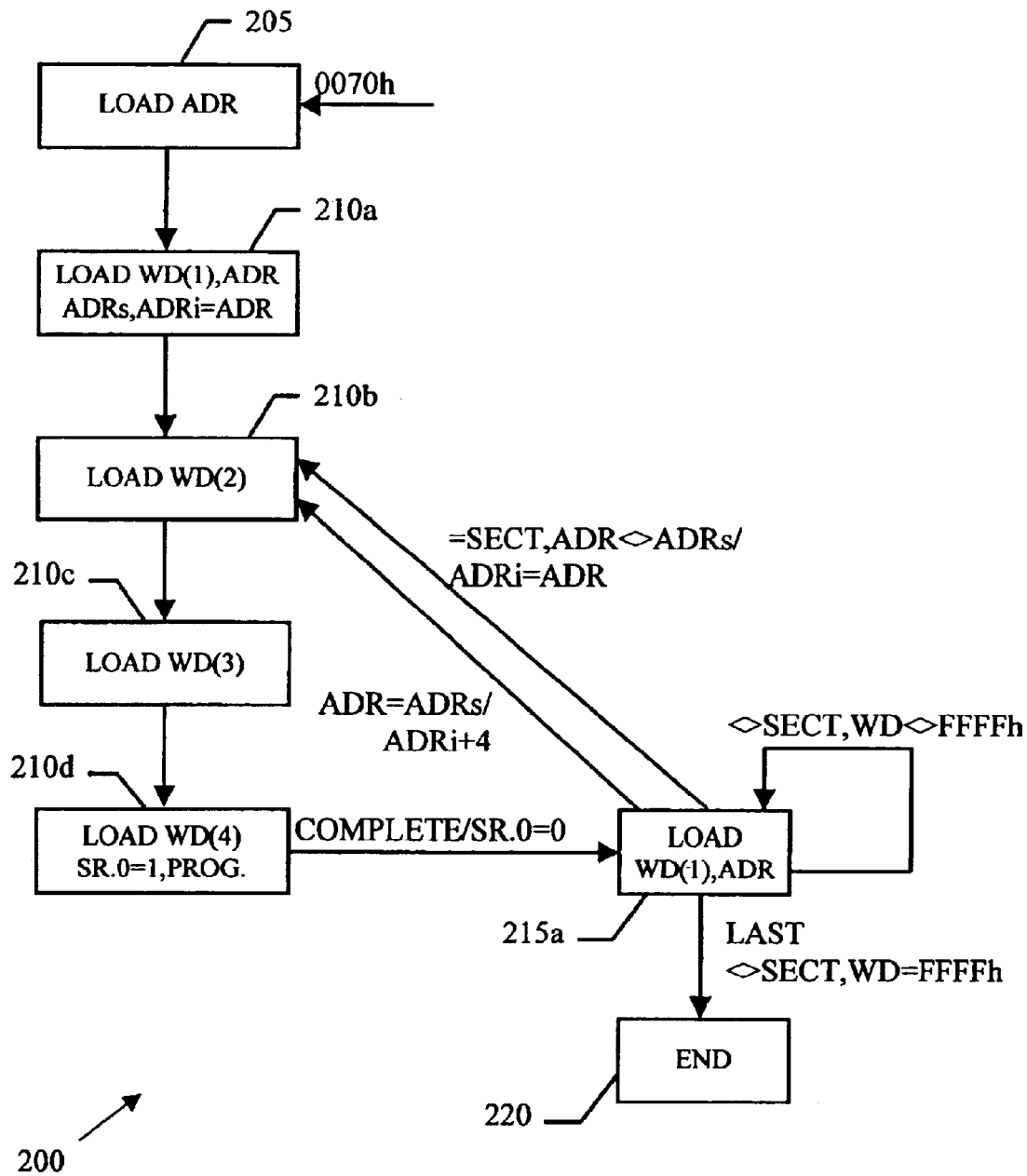
FIG. 2 shows the logic of operation of the memory device in a simplified state diagram.

Considering now FIG. 2, the operation of the flash memory (during the programming procedure) is described with reference to a state diagram 200 of the command interface. The command interface evolves between different stable states at each clock signal CLK (not shown in the drawing for the sake of simplicity).

Particularly, the command interface reaches a starting state 205 in response to a specific input command CMD (for example, 0070h). At the next clock signal CLK, the interface switches to a first loading state 210a, in which the input word WD and the input address ADR are loaded into the respective buffers. The input word WD is then latched into the first portion of the page buffer; at the same time, the starting address ADRs and the internal address ADRi are both set to the input address ADR.

At each next clock signal CLK, the command interface switches in succession to a sequence of further loading states 210b, 210c and 210d. In each state 210b–210d, the input word WD is loaded into the I/O buffer and is latched into the corresponding portion of the page buffer.

Furthermore, in the last state 210d of the sequence the flag SR.0 is asserted (for signaling to the programming device that the flash memory cannot accept further input words WD); at the same time, the execution of a programming operation on the matrix is started.

The programming operation involves a writing phase, wherein all the words of the page PG are written simultaneously into the set of locations selected by the internal address ADRi. The writing phase is immediately followed by a verification phase. In this phase, the written page PGw (read with a safety margin from the matrix) is compared with the desired page PG. If the result of the verification is negative, the controller attempts to re-write the relevant memory cells until the page PG is written correctly. The programming operation is set to stop and output a failure signal if a write does not occur after a predetermined number of attempts.

As soon as the programming operation has been completed (irrespective of its result), the command interface switches to a further first loading state 215a, and simultaneously de-asserts the flag SR.0 (for allowing the programming device to provide further input words WD). In this state 215a, the input word WD and the input address ADR are loaded into the respective buffers.

If the internal address ADRi identifies a last set of locations of the current sector, the command interface switches to a final state 220 (irrespective of the input information). Instead, when the end of the sector has not been reached yet, the command interface verifies whether the new input address ADR identifies the current sector (by means of a comparison with the internal address ADRi or the starting address ADRs). If the result of the verification is positive, the command interface returns to the state 210b and simultaneously drives the latching of the input word WD into the first portion of the page buffer. Furthermore, if the input address ADR has remained equal to the starting address ADRs, the internal address ADRi is automatically incremented so as to address the immediately following set of locations (ADRi+4); instead, if a new input address ADR has been provided (different from the starting address ADRs but always in the same sector), the internal address ADRi is set to the new input address ADR (skipping one or more sets of locations in the sector).

When the new input address ADR does not identify the current sector, the command interface verifies whether an input command CMD, specific for ending the programming procedure, has been provided (for example, FFFFh). If the result of the verification is positive, the command interface switches to the final state 220. On the contrary, the command interface remains in the state 215a so that the unintentional writing of another sector is prevented.

Of course, the concepts of the present invention are also applicable when the command interface implements a different state diagram, when the verification of the written page is executed in another way, when some actions are driven at different times (for example, providing additional dedicated states), and the like.

Figure 3:
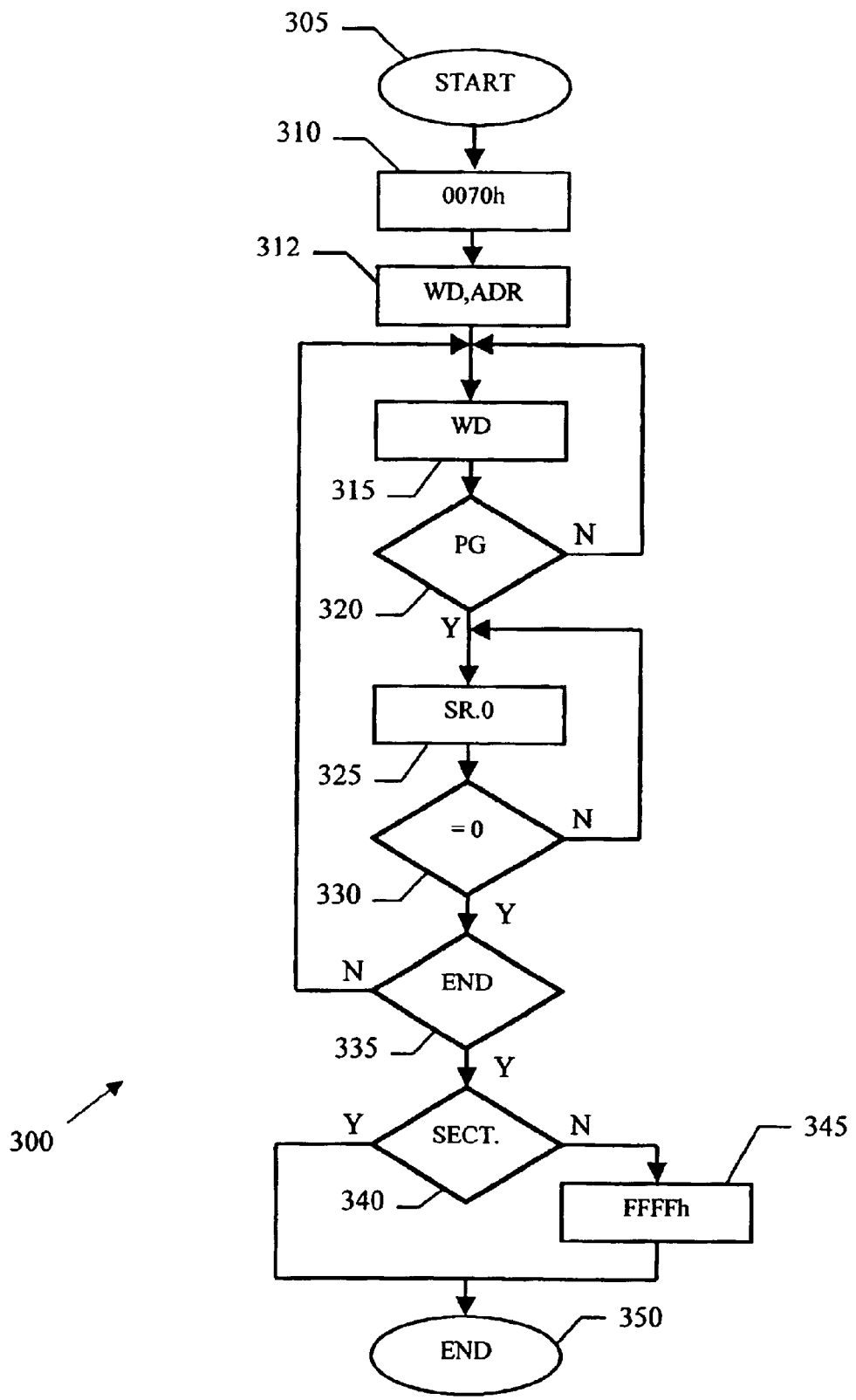
FIG. 3 is a flow chart that describes a procedure of programming the memory device.

Passing to FIG. 3, the programming procedure of the flash memory is implemented by the execution of a method 300 under the control of the programming device. The method starts at block 305, and then passes to block 310 in which the programming device provides the command 0070h to the flash memory. Continuing to block 312, the programming device transmits the first word to be written and the starting address for the programming procedure to the flash memory.

The method then performs a loop, which involves the operation at block 315 of providing a further word to be written to the flash memory. As soon as a page has been completed (with 3 iterations at the first execution of the loop and with 4 iterations at each next execution thereof), the output condition of the cycle is satisfied at control block 320. Of course, the number of iterations can change based on the size of the word. Consequently, the method proceeds to block 325, in which the programming device polls the flag SR.0. A test is executed at decision block 330 to determine whether the programming operation has been completed (flag SR.0 de-asserted). If not, the method returns to block 325 in a waiting loop. As soon as the flag SR.0 is de-asserted, the programming device at block 335 verifies whether the last desired page has been provided to the flash memory. If not, the method returns to block 315 for executing the same operations on a next page.

Once the last page to be written onto the flash memory has been processed, the method enters decision block 340. If the end of the current sector has not been reached, the programming device at block 345 provides the command FFFFh to the flash memory; the method then ends at the final block 350; otherwise, the method descends into the final block 350 directly.

The concepts of the present invention are also applicable when the programming procedure implements another equivalent method, when additional steps are provided (for example, with the programming device that verifies, by reading the state register, a total result of the programming procedure at the end thereof), and the like.

More generally, the present invention proposes a non-volatile memory device suitable to be programmed in a sequential mode. The device includes a plurality of blocks of memory cells each one for storing a word; each block is identified by an address. Means are provided for loading an input address at the beginning of a programming procedure. Other means are used for setting an internal address to the input address. The device of the invention further includes means for loading a predetermined number of input words in succession. Means are provided for latching a page consisting of the predetermined number of input words. Other means are used for executing a programming operation; this operation includes writing the page in the blocks identified by consecutive addresses starting from the internal address. At the end, means are included for incrementing the internal address of the predetermined number in response to the completion of the programming operation.

The memory device according to the present invention offers an improved sequential programming speed; without detracting from the general applicability of the invention, this advantage is particularly evident when the memory device has a high capacity.

The proposed solution allows both writing more words simultaneously and increasing the address inside the memory device automatically. In this way, the memory device combines the advantages of a parallel multi-programming and of an internal management of the address; particularly, the programming device can supply the starting address of the programming procedure only once to the memory device.

The proposed memory device supports a programming procedure that is specifically optimized for a production environment (even if other applications are not excluded). Particularly, this involves a high speed of a production line of the apparatuses that embody the memory devices; consequently, the yield of the production line is increased, with a corresponding reduction of the cost of those apparatuses.

The preferred embodiment of the invention described above offers further advantages.

Particularly, each page is verified (and re-written, if it is necessary) immediately after it has been written.

This allows providing the information to be written only once to the flash memory (with a consequent reduction of the duration of the whole programming procedure). It should be observed that this approach (which aim is to minimize the switching of the input address) is completely different from the one that is used in the method EFP known in the art (which aim is instead to minimize the voltage switching between the programming and reading operation modes).

Preferably, a new input address is loaded at the completion of each programming operation.

This feature is used to implement different modes of controlling the programming procedure.

Advantageously, the programming procedure is terminated when the end of the current sector has been reached.

This allows stopping the programming procedure automatically once the sector is complete.

The same result is achieved if the new input address does not identify the current sector and the input word is equal to a predetermined value (FFFFh).

In this way, it is possible to terminate the programming procedure in a very simple way.

As a further enhancement, the internal address is set to the new input address if this new input address identifies the current sector but is different from the starting address.

This allows skipping one or more sets of locations in the sector.

Advantageously, the input word is discarded if the new input address does not identify the current sector.

Consequently, the unintentional writing of other sectors is prevented automatically.

In a preferred embodiment of the invention, a flag for a busy state is asserted when all the words of a page have been loaded and is de-asserted when the programming operation has been completed.

This flag is used to synchronize the operation of the programming device.

Alternatively, the verification of the written words is executed in another way, the matrix of memory cells consists of a single sector, or the input address is loaded at the beginning of the programming procedure only. Furthermore, the programming procedure can continue on more sectors automatically or can be terminated in another way (for example, using a dedicated pin). The memory device of the present invention is also suitable to be implemented without supporting the possibility of skipping intermediate sets of locations, or without a mechanism for preventing the unintentional writing of other sectors; furthermore, it can be allowed jumping to a different sector, or a different mode of synchronization can be implemented (for example, exploiting a dedicated pin).

Furthermore, it should be noted that the programming device that can be used to control the sequential programming of the above-described flash memory leads itself to be implemented even as a stand-alone product.

Naturally, in order to satisfy local and specific requirements, a person skilled in the art may apply to the solution described above many modifications and alterations all of which, however, are included within the scope of protection of the invention as defined by the following claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A non-volatile memory device suitable to be programmed in a sequential mode comprising:
 a plurality of blocks of memory cells each one for storing a word, each block being identified by an address;
 means for loading an input address at the beginning of a programming procedure;
 means for setting an internal address to the input address;
 means for loading a predetermined number of input words in succession;
 means for latching a page consisting of the predetermined number of input words
 means for executing a programming operation including writing the page in the blocks identified by consecutive addresses starting from the internal address; and
 means for incrementing the internal address of the predetermined number in response to the completion of the programming operation.

2. The device according to claim 1 further including:
 a state register coupled to programming operation means for outputting an indication of the state of the programming operation.

3. The device according to claim 1 wherein the memory cells are partitioned into a plurality of sectors, the writing operation being executed on a current sector, and wherein the device further includes means for loading a new input address in response to the completion of the writing operation.

4. The device according to claim 3, further including means for terminating the programming procedure when the internal address reaches an end of the current sector.

5. The device according to claim 3, further including means for terminating the programming procedure if the new input address does not identify the current sector and the input word is equal to a predetermined value.

6. The device according to claim 3, further including means for storing a starting address equal to the input address and means for setting the internal address to the new input address if the new input address identifies the current sector and is different from the starting address.

7. The device according to claim 3, further including means for discarding the input word if the new input address does not identify the current sector.

8. The device according to claim 3, further including means for asserting a flag for a busy state of the device in response to the loading of the predetermined number of words and for de-asserting the flag in response to the completion of the programming operation.

9. A method of programming a non-volatile memory device in a sequential mode including a plurality of blocks of memory cells each one for storing a word, each block being identified by an address, the method including the steps of:
 loading an input address at the beginning of a programming procedure, and
 setting an internal address to the input address,
 characterized by
 repeating a plurality of times the steps of:
  loading a predetermined number of input words in succession,
  latching a page consisting of the predetermined number of input words,
  executing a programming operation including writing the page in the blocks identified by consecutive addresses starting from the internal address, and
  incrementing the internal address of the predetermined number in response to the completion of the programming operation.

10. The method according to claim 9 wherein the step of executing (210d) a programming operation further includes:
 verifying the written page, and
 at least partially re-writing the page in response to a negative result of the verification.

11. The method according to claim 9 wherein the memory cells are partitioned into a plurality of sectors, the writing operation being executed on a current sector, and wherein the method further includes the step of:
 loading a new input address in response to the completion of the writing operation.

12. The method according to claim 11, further including the step of:
 terminating the programming procedure when the internal address reaches an end of the current sector.

13. The method according to claim 11, further including the step of:
 terminating the programming procedure if the new input address does not identify the current sector and the input word is equal to a predetermined value.

14. The method according to claim 11, further including the steps of:
 storing a starting address equal to the input address, and
 setting the internal address to the new input address if the new input address identifies the current sector and is different from the starting address.

15. The method according to claim 11, further including the step of:
 discarding the input word if the new input address does not identify the current sector.

16. The method according to claim 11, further including the steps of:
 asserting a flag for a busy state of the device in response to the loading of the predetermined number of words, and
 de-asserting the flag in response to the completion of the programming operation.

17. A programming device for controlling the programming in a sequential mode of a non-volatile memory device including means for providing an input address at the beginning of a programming procedure, means for providing a predetermined number of input words in succession without increasing the input address, and means for waiting for the completion of a programming operation of a page consisting of the predetermined number of input words.

18. A method of controlling the programming in a sequential mode of a non-volatile memory device including the steps of:

providing an input address at the beginning of a programming procedure, and repeating a plurality of times the steps of:
   providing a predetermined number of input words in succession without increasing the input address, and
   waiting for the completion of a programming operation of a page consisting of the predetermined number of input words.

* * * * *